(12) United States Patent
Pang et al.

(10) Patent No.: US 11,796,809 B2
(45) Date of Patent: Oct. 24, 2023

(54) DISPLAY MODULE AND MANUFACTURING METHOD THEREOF

(71) Applicant: GUANGZHOU LUXVISIONS INNOVATION TECHNOLOGY LIMITED, Guangzhou (CN)

(72) Inventors: Chao Pang, Guangzhou (CN); LingYun Mi, Guangzhou (CN)

(73) Assignee: GUANGZHOU LUXVISIONS INNOVATION TECHNOLOGY LIMITED, Guangzhou (CN)

( * ) Notice: Subject to any disclaimer, the term of this patent is extended or adjusted under 35 U.S.C. 154(b) by 0 days.

(21) Appl. No.: 17/884,595

(22) Filed: Aug. 10, 2022

(65) Prior Publication Data

US 2023/0296888 A1    Sep. 21, 2023

(30) Foreign Application Priority Data

Mar. 18, 2022 (CN) .......................... 202210268436.3

(51) Int. Cl.
| | |
|---|---|
| *G02B 27/01* | (2006.01) |
| *G02B 7/02* | (2021.01) |
| *G02B 27/28* | (2006.01) |
| *G02F 1/13363* | (2006.01) |
| *G02F 1/1335* | (2006.01) |
| *H10K 50/80* | (2023.01) |
| *H10K 71/00* | (2023.01) |

(52) U.S. Cl.
CPC .......... *G02B 27/0101* (2013.01); *G02B 7/02* (2013.01); *G02B 27/286* (2013.01); *G02F 1/133526* (2013.01); *G02F 1/133536* (2013.01); *G02F 1/133638* (2021.01); *H10K 50/868* (2023.02); *H10K 71/00* (2023.02)

(58) Field of Classification Search
CPC .................................................. G02B 27/0101
See application file for complete search history.

(56) References Cited

U.S. PATENT DOCUMENTS

| | | | | |
|---|---|---|---|---|
| 10,955,672 | B1* | 3/2021 | Wheelwright | G02B 27/286 |
| 11,187,924 | B2* | 11/2021 | McDowall | G02F 1/0136 |
| 2018/0239146 | A1* | 8/2018 | Bierhuizen | G02B 27/0101 |
| 2020/0089017 | A1* | 3/2020 | Wu | G02B 27/0172 |

* cited by examiner

*Primary Examiner* — Edmond C Lau

(57) ABSTRACT

A display module and manufacturing method thereof. The display module comprises a display screen, a first absorption polarizer, a first quarter wave plate, an optical lens component, and a convex lens component in sequence from a display side to a viewing side. The optical lens component and the convex lens component are optically coaxial. The convex lens component comprises a convex lens, a second absorption polarizer, and an optical integrated element, which are laminated in sequence from the viewing side to the display side. The optical integrated element comprises a second quarter wave plate and, on one side surface of the optical integrated element, a coated reflective polarizing film or a nano-imprinted metal grating. The reflective polarizing film or the metal grating is attached to the second absorption polarizer.

12 Claims, 7 Drawing Sheets

DISPLAY MODULE AND MANUFACTURING METHOD THEREOF

CROSS-REFERENCE TO RELATED APPLICATION

This application claims the priority benefit of Chinese Patent Application Serial Number 202210268436.3, filed on Mar. 18, 2022, the full disclosure of which is incorporated herein by reference.

BACKGROUND

Technical Field

The present disclosure relates to the technical field of displaying, particularly to a display module and a manufacturing method thereof.

Related Art

Display modules in conventional virtual reality devices now generally adopt the Pancake folded optical path solution for ultra-short focus distance.

FIG. 1 depicts an exploded schematic diagram of a conventional display module adopting the Pancake folded optical path solution. As shown in the figure, a display module 100 comprises a display screen component 110, a transflective lens 120, and a convex lens component 130 in sequence from a display side to a viewing side. The display screen component 110 comprises a display screen 112, a first absorption polarizer 114, and a first quarter wave plate 116 sequentially laminated through a transparent glue 90. The convex lens component 130 comprises a convex lens 132, a second absorption polarizer 134, a reflective polarizer 136, a second quarter wave plate 138, and an anti-reflection film 139 laminated through a transparent glue 90. The folded-type light path of the light emitted by the display screen 112 from being incident on the first absorption polarizer 114 to being emitted from the convex lens 132 and entering the human eye for imaging is shown by the solid arrow in FIG. 1. Since the light needs to undergo 15 reflections, scattering and transmission (shown by the dashed arrow in FIG. 1) in the light path from the first incident to the anti-reflection film 139 to the reflective polarizer 136 (that is, the light path of the first incident to the convex lens component 130 to the reflective polarizer 136). Thus, the energy possessed in a regular light path is weakened, showing an issue that the utilization rate of light energy is lowered.

SUMMARY

The embodiments of the present disclosure provide a display module and manufacturing method tended to solve the problem of weakened light energy in the regular light path and thereby low light energy utilization rate due to multiple reflections, scattering, and transmission in the folded-type light path of conventional display module.

In the first aspect, the present disclosure provides a display module, comprising a display screen component, an optical lens component, and a convex lens component in sequence from a display side to a viewing side. The optical lens component and the convex lens component are optically coaxial. The display screen component comprises a display screen, a first absorption polarizer, and a first quarter wave plate in sequence from the display side to the viewing side. The convex lens component comprises a convex lens, a second absorption polarizer, and an optical integrated element, which are laminated in sequence from the viewing side to the display side. The optical integrated element comprises a second quarter wave plate and, on one side surface of the optical integrated element, a coated reflective polarizing film or a nano-imprinted metal grating. The reflective polarizing film or the metal grating is attached to the second absorption polarizer. Wherein an absorption axis of the first absorption polarizer is parallel to an absorption axis of the second absorption polarizer. A fast axis of the second quarter wave plate and a grating extension direction of the metal grating form an angle of 45 degrees. The fast axis of the second quarter wave plate and a transmission axis of the reflective polarizing film form an angle of 45 degrees. The absorption axis of the first absorption polarizer and a fast axis of the first quarter wave plate form an angle of 45 degrees. The absorption axis of the second absorption polarizer and the fast axis of the second quarter wave plate form an angle of 45 degrees.

In the second aspect, the present disclosure provides a method for manufacturing display module, comprising the steps of: coating a reflective polarizing film or nano-imprinting a metal grating on one side of the second quarter wave plate to form an optical integrated element, wherein a fast axis of the second quarter wave plate and a grating extension direction of the metal grating form an angle of 45 degrees, a fast axis of the second quarter wave plate and the transmission axis of the reflective polarizing film form an angle of 45 degrees; attaching a second absorption polarizer to one side surface of the convex lens, and attaching the reflective polarizing film or the metal grating to the second absorption polarizer to form a convex lens component, wherein an absorption axis of the second absorption polarizer and the fast axis of the second quarter wave plate form an angle of 45 degrees; assembling an optical lens component in the bracket; laminating a display screen, a first absorption polarizer, and a first quarter wave plate in sequence to form a display screen component, wherein an absorption axis of the first absorption polarizer and a fast axis of the first quarter wave plate form an angle of 45 degrees; assembling the bracket equipped with the optical lens component to the display screen component by an active alignment machine according to the principle of coincidence of a normal line in a physical center of an effective area of the display screen and an optical axis of the optical lens component; and forming a display module by assembling the convex lens component in the bracket through the active alignment machine as the optical lens component and the convex lens component are optically coaxial and the absorption axis of the first absorption polarizer and the absorption axis of the second absorption polarizer are parallel, wherein one side of the convex lens without being attached to the second absorption polarizer faces the viewing side.

In the embodiment of the present application, through the optical integrated element (the optical integrated element comprises the second quarter wave plate and, on one side surface of the optical integrated element, the coated reflective polarizing film or the nano-imprinted metal grating) having the functions of phase delay and reflective polarization, the number of times of reflection, scattering and transmission of light emitted by the display screen in the folded-type light path can be reduced to improve the utilization rate of light energy and reduce the thickness of the display module.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

Figure 1:
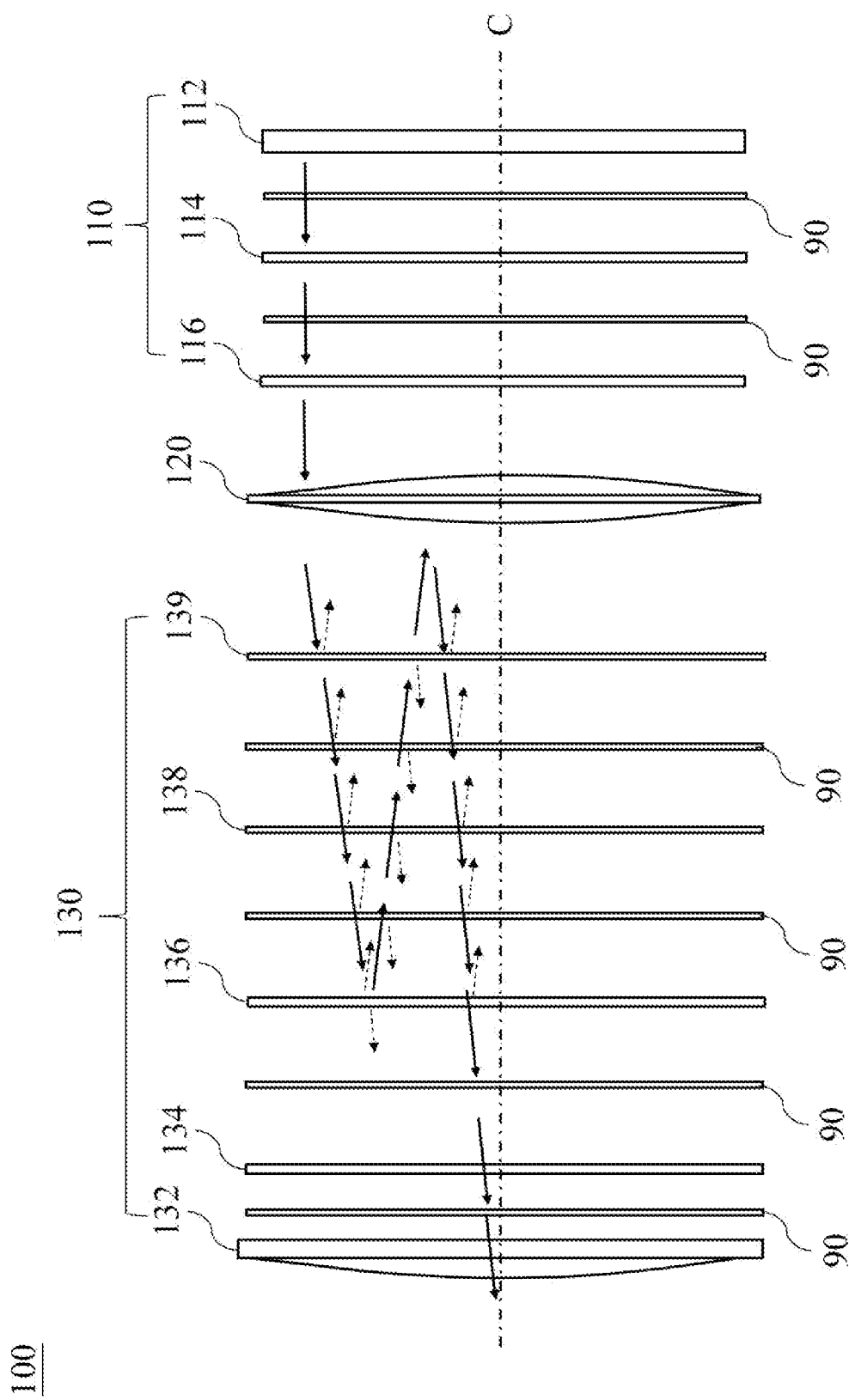
FIG. 1 is an exploded schematic diagram of a display module that adopts conventional Pancake folded-type optical path scheme.
Figure 2:
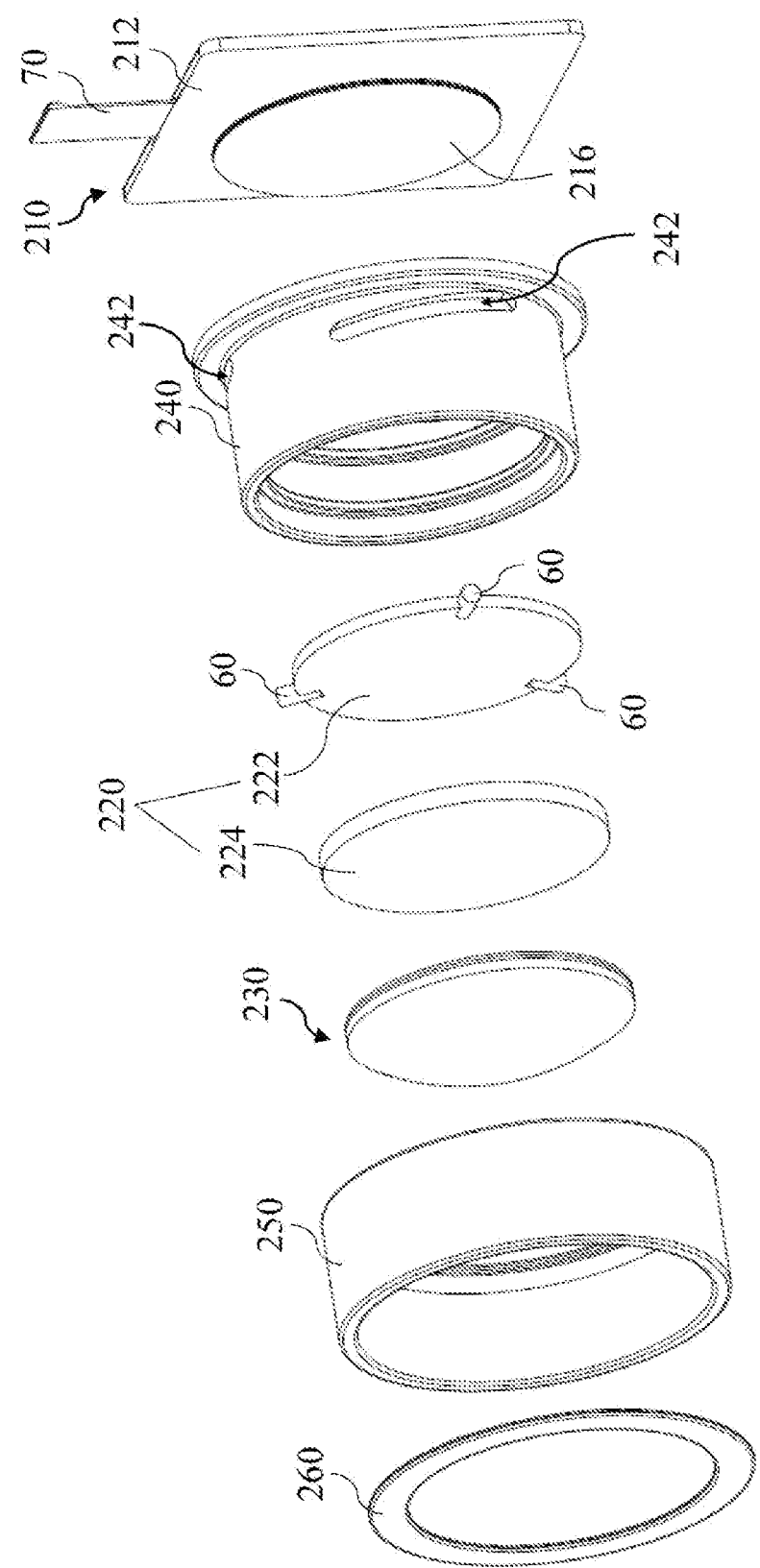
FIG. 2 is an exploded view of a display module of an embodiment of the present disclosure.
Figure 3:
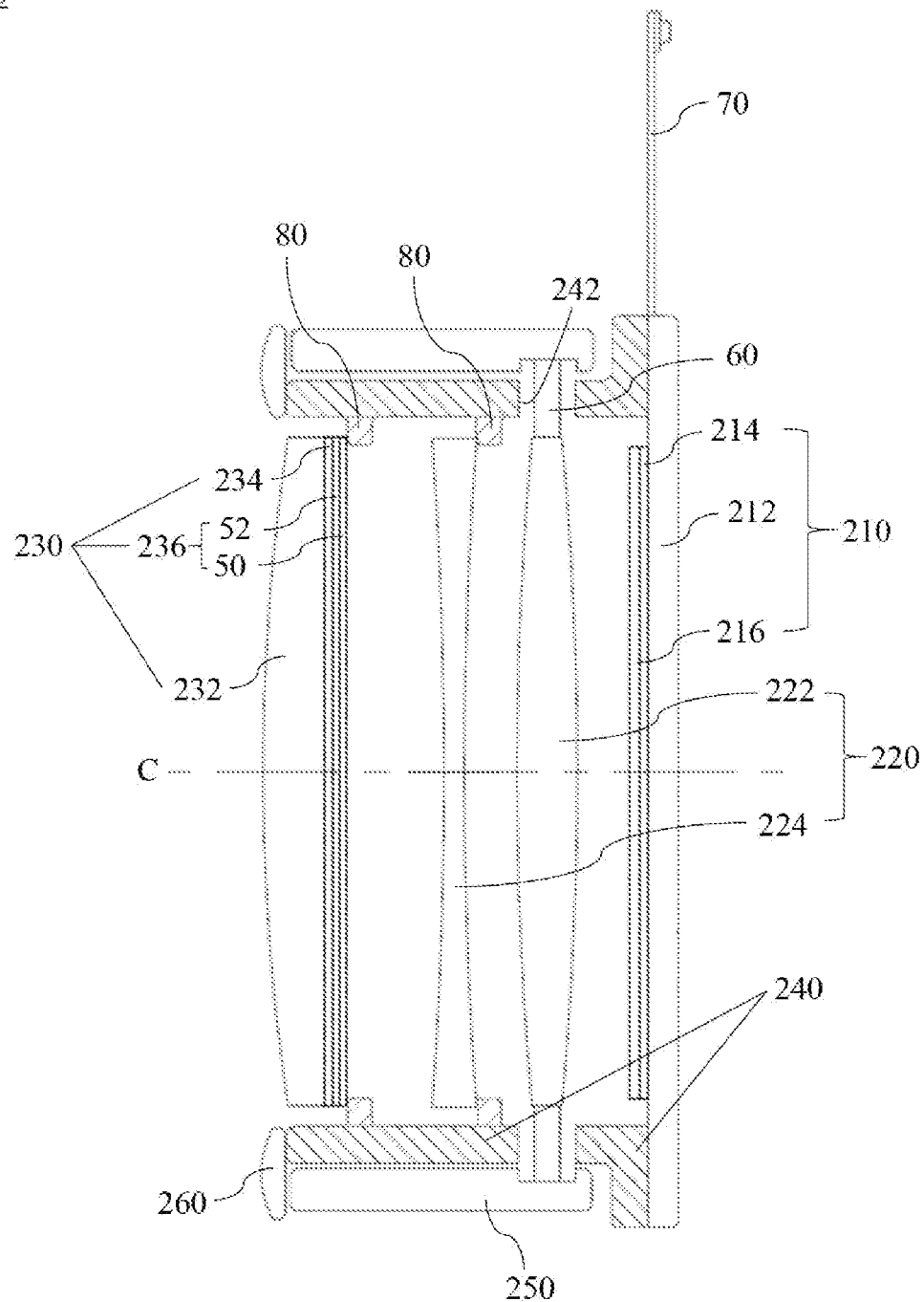
FIG. 3 is a cross-sectional view of a display module of an embodiment in FIG. 2.
Figure 4:
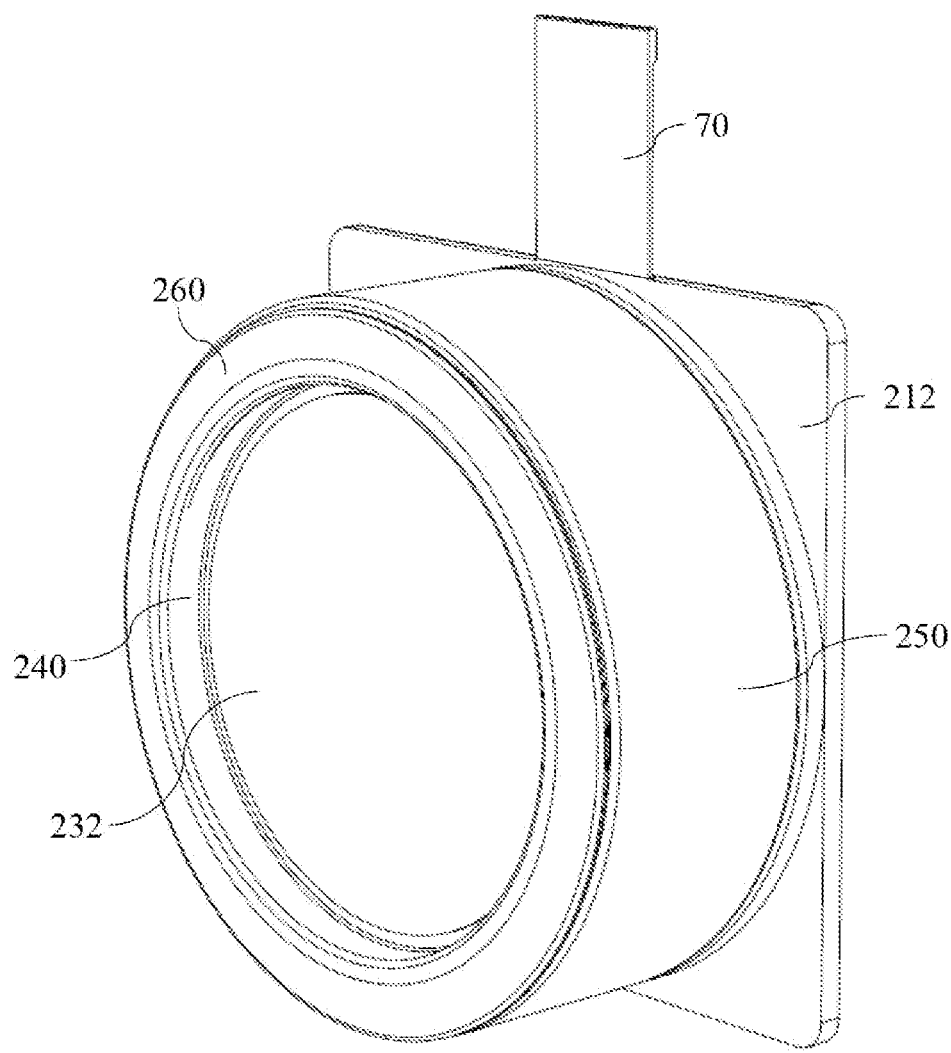
FIG. 4 is a combined view of the display module of an embodiment in FIG. 2.

FIG. 2 is an exploded view of a display module of an embodiment of the present disclosure. FIG. 3 is a cross-sectional view of a display module of an embodiment in FIG. 2. FIG. 4 is a combined view of the display module of an embodiment in FIG. 2. A display module 200 can be applied to a virtual reality device that realizes the immersion of virtual reality, and provides a virtual reality image on the left or right corresponding to a position of the left eye or right eye of users (i.e., a virtual reality device comprises two display modules 200). As shown in FIG. 2 to FIG. 4, the display module 200 comprises a display screen component 210, an optical lens component 220, and a convex lens component 230 in sequence from a display side (the light emitting side of the display screen) to a viewing side (one side close to human eye), where the optical lens component 220 and the convex lens component 230 are optically coaxial (in common optical axis C). The display screen component 210 comprises a display screen 212, a first absorption polarizer 214, and a first quarter wave plate 216 in sequence from the display side to the viewing side. Wherein, the display screen 212 may be, but not limited to, an LCD screen or an OLED screen, for example, an LCD screen with a resolution above 4K (high resolution quality), having excellent contrast, color gamut range, and color accuracy. The display screen 212 can be connected to an external circuit through a flexible circuit board (FPC) 70. The thickness of the first absorption polarizer 214 may be less than or equal to 0.08 mm and greater than or equal to 0.04 mm, and the polarization rate of the first absorption polarizer 214 may be greater than or equal to 99.9%. An absorption axis of the first absorption polarizer 214 and a fast axis of the first quarter wave plate 216 form an angle of 45 degrees. The first quarter wave plate 216 can delay the phase by $\pi/2$ or its odd multiples in the entire visible light band from 400 nm to 700 nm, and the delay accuracy can be but not limited to ±5%.

In this embodiment, the optical lens component 220 may comprise a low-transmission and high-reflection lens 222 and a low-reflection concave lens 224 in sequence from the display side to the viewing side, where the reflectivity of the low-transmission and high-reflection lens 222 may be 65%±10%, and the transmittance may be 35%±10%. The low-transmission and high-reflection lens 222 can be a high-refractive-index optical resin lens, and the material of which can be selected from optical resin with a density of 1.1 $g/cm^3$ to reduce the weight and thickness. The low-reflection concave lens 224 can be an aspheric and high-refractive-index optical resin lens, that having a refractive index greater than or equal to 1.9, and the material can be selected from optical resin with low density (for example 1.1 $g/cm^3$) to reduce the weight. In another embodiment, the optical lens component 220 may include a semi-transmission-reflective lens, the light transmittance, and reflectivity of which are respectively 50%.

In this embodiment, the convex lens component 230 comprises a convex lens 232, a second absorption polarizer 234, and an optical integrated element 236, which are laminated in sequence from the viewing side to the display side. The optical integrated element 236 comprises a second quarter wave plate 50 and a reflective polarizing film 52 coated on one side surface of the optical integrated element 236. The reflective polarizing film 52 is attached to the second absorption polarizer 234. An absorption axis of the first absorption polarizer 214 is parallel to an absorption axis of the second absorption polarizer 234. The fast axis of the second quarter wave plate 50 and a transmission axis of the reflective polarizing film 52 form an angle of 45 degrees. The absorption axis of the second absorption polarizer 234 and the fast axis of the second quarter wave plate 50 form an angle of 45 degrees. Wherein, the material of the second quarter wave plate 50 may be, but not limited to, polycarbonate (PC), polyethylene terephthalate (PET), triacetate cellulose (TAC), polymethylmethacrylate (PMMA), or cyclic olefin polymer (COP), and the temperature resistance requirement of which may be, but not limited to, dry baking at a temperature of 105 degrees Celsius for 1000 hours. The reference value of the phase delay accuracy of the second quarter wave plate 50 in the visible light band from 400 nm to 700 nm may be, but not limited to, ±15%. The material of the reflective polarizing film 52 may include but not limited to metals such as zirconium, titanium, and their oxides.

In this embodiment, the folded-type optical path in the display module 200 may be: light emitted by the display screen 212 becomes P light after passing through the first absorption polarizer 214; the P light is modulated into left-handed circularly polarized light after passing through the first quarter wave plate 216; a part of the left-handed circularly polarized light passes through the low-transmission and high-reflection lens 222 and the low-reflection concave lens 224, then is converted to S light by the second quarter wave plate 50. The S light is reflected back to the second quarter wave plate 50 by the reflective polarizing film 52 to be modulated into right-handed circularly polarized light; a part of the right-handed circularly polarized light passes through the low-reflection concave lens 224 and is then reflected by the low-transmission and high-reflection lens 222 and passes through the low-reflection concave lens 224 again, then is converted into P light by the second quarter wave plate 50; the P light passes through the reflective polarizing film 52, the second absorption polarizer 234, and the convex lens 232, and finally enters human eye to form an enlarged virtual image. Wherein, an optically transparent adhesive is applied between the display screen 212 and the first absorption polarizer 214, between the first absorption polarizer 214 and the first quarter wave plate 216, between the convex lens 232 and the second absorption polarizer 234, and between the reflective polarizing film 52 and the second absorption polarizer 234. The light emitted from the display screen 212 only undergoes three times of reflections, scattering, and transmission from the first incident into the convex lens component 230 to the second absorption polarizer 234, so the utilization rate of light energy can be improved.

In another embodiment, one side surface of the second quarter wave plate 50 is not coated with a reflective polarizing film 52, but with a nano-imprinted metal grating, which is attached to the second absorption polarizer 234. The fast axis of the second quarter wave plate 50 and the extension direction of the metal grating form an angle of 45 degrees. The material of the metal grating may include, but not limited to, metals such as aluminum, silver, or titanium, and alloy materials thereof. So, the reflective polarizing film 52 can be replaced by the metal grating.

Thus, in the display module 200: definition can be improved through high quality display screen 212; scattered light reflected by interfaces can be reduced with linear polarizers having high polarization efficiency; the polarization state of the folded-type optical path can be precisely controlled by the first quarter wave plate 216 having high delay accuracy; the transmitted scattered light in the display module 200 can be reduced by the low-transmission and high-reflection lens; the definition of the four corners and distortion on the display can be improved by the low-transmission and high-reflection lens 222, the low-reflection concave lens 224, and the convex lens 232; the number of times of reflection, scattering and transmission of the light emitted from the display screen 212 in the folded-type optical path can be reduced by the optical integrated element 236 (the optical integrated element 236 comprises the second quarter wave plate 50 and, on one side surface of the optical integrated element 236, the coated reflective polarizing film 52 or the nano-imprinted metal grating) having phase delay and reflective polarization functions (reducing the reflective polarizer 136, anti-reflection film 139, and the transparent adhesive used for lamination in the display module 100 of prior art), to improve the utilization rate of light energy and reduce the thickness of the display module 200.

In one embodiment, the transmittance of the reflective polarizing film 52 or the metal grating to the P light may be greater than or equal to 85±15%, the reflectivity of the reflective polarizing film 52 or the metal grating to the S light may be greater than or equal to 85±15%, and the transmittance of the reflective polarizing film 52 or the metal grating to the S light may be less than or equal to 2%. Thus, unnecessary light loss can be reduced, normal image brightness can be maximized, and scattered light such as direct transmission can be improved.

In one embodiment, the thickness of the reflective polarizing film 52 or the metal grating may be greater than or equal to 300 nm and less than or equal to 1 μm.

In one embodiment, the thickness of the second quarter wave plate 50 may be greater than or equal to 50 μm and less than or equal to 200 μm. Preferably, the thickness of the second quarter wave plate 50 may be 60 μm, 100 μm, or 180 μm.

In one embodiment, one side of the second quarter wave plate 50 opposite to the reflective polarizing film 52 or the metal grating can be coated with an ultra-low reflection film layer, pasted with an ultra-low reflection film, or pasted with a lens coated with the ultra-low reflection film. So, the optical integrated element 236 can have low reflectivity.

In one embodiment, the reflectivity of the ultra-low reflection film layer or the ultra-low reflection film to visible light may be less than or equal to 0.5%.

In one embodiment, the thickness of the ultra-low reflection film layer or the ultra-low reflection film may be less than or equal to 1 μm. Preferably, the thickness of the ultra-low reflection film layer or the ultra-low reflection film may be less than or equal to 500 nm.

In one embodiment, the ultra-low reflection film layer or the ultra-low reflection film may comprise one or more layers of film material, where film material may include, but not limited to, titanium oxide and silicon dioxide, and the number of layers of film material can be, but not limited to 6 or 8 layers. When the ultra-low reflection film layer or the ultra-low reflection film comprises a multi-layer film material, it can be formed by alternately stacking titanium oxide and silicon dioxide.

Refer to table 1 and table 2 below, table 1 shows the measured data of the display module 100, and table 2 presents the measured data of replacing the convex lens component 130 of the display module 100 with the convex lens component 230 of present disclosure. The optical integrated element 236 comprises the second quarter wave plate 50, the reflective polarizing film 52 or the metal grating, and the ultra-low reflection film layer or the ultra-low reflection film or the lens coated with the ultra-low reflection film. It can be seen from table 1 and table 2 that, except for the very little difference in the reflectivity of the anti-reflection film, since the convex lens component 230 is able to minimize unwanted reflections within the material (the reflective polarizer 136, the anti-reflection film 139, and the transparent adhesive for lamination of the display module 100 in prior art), the convex lens component 130 of the display module 100 is replaced with the convex lens component 230 of the present disclosure, and the measured transmittance and the reflectance of the convex lens component 230 respectively to the P light and the S light are slightly increased.

TABLE 1

| | wavelength (nm) | | | | | | |
|---|---|---|---|---|---|---|---|
| | 400 | 425 | 450 | 475 | 500 | 525 | 550 |
| P light transmittance (%) | 88.4 | 89.2 | 90.8 | 90.5 | 90.9 | 90.5 | 91.4 |
| S light transmittance (%) | 87.7 | 89.3 | 90.2 | 90.6 | 90.3 | 90.4 | 90.9 |
| anti-reflection film reflectance (%) | 0.3 | 0.2 | 0.2 | 0.3 | 0.3 | 0.3 | 0.3 |

| | wavelength (nm) | | | | | | |
|---|---|---|---|---|---|---|---|
| | 575 | 600 | 625 | 650 | 675 | 700 | average |
| P light transmittance (%) | 91.4 | 91.5 | 91.6 | 91.6 | 91.7 | 91.7 | 90.86 |
| S light transmittance (%) | 90.7 | 90.9 | 91.2 | 91.1 | 91.3 | 91.3 | 90.45 |
| anti-reflection film reflectance (%) | 0.3 | 0.2 | 0.3 | 0.3 | 0.3 | 0.3 | 0.26 |

TABLE 2

| | wavelength (nm) | | | | | | |
|---|---|---|---|---|---|---|---|
| | 400 | 425 | 450 | 475 | 500 | 525 | 550 |
| P light transmittance (%) | 89.5 | 89.9 | 90.4 | 91.1 | 91.0 | 91.3 | 91.5 |
| S light transmittance (%) | 88.9 | 89.9 | 90.3 | 90.7 | 91.2 | 90.9 | 91.3 |
| anti-reflection film reflectance (%) | 0.2 | 0.2 | 0.3 | 0.3 | 0.2 | 0.3 | 0.3 |

| | wavelength (nm) | | | | | | |
|---|---|---|---|---|---|---|---|
| | 575 | 600 | 625 | 650 | 675 | 700 | average |
| P light transmittance (%) | 91.9 | 91.8 | 91.9 | 91.8 | 91.9 | 92.0 | 91.22 |
| S light transmittance (%) | 91.3 | 91.7 | 91.9 | 91.8 | 92.0 | 91.8 | 91.04 |
| anti-reflection film reflectance (%) | 0.3 | 0.3 | 0.3 | 0.3 | 0.3 | 0.3 | 0.27 |

In one embodiment, referring to FIG. 2 and FIG. 3, the display module 200 may further include a bracket 240, in which the optical lens component 220 and the convex lens component 230 are assembled. According to the principle of coincidence of a normal line in a physical center of an effective area of the display screen and an optical axis of the optical lens component, the bracket 240 is assembled to the display screen component 210.

In one embodiment, referring to FIG. 2 and FIG. 3, in addition to the bracket 240, the display module 200 may also comprise a knob 250 and a snap ring 260. The low-transmission and high-reflection lens 222, the low-reflection concave lens 224, and the convex lens component 230 are assembled in the bracket 240. The knob 250 is sleeved on an outer side of the bracket 240, and the snap ring 260 is clamped to the bracket 240 and restricts the movement of the knob 250 in an optical axis direction. The bracket 240 is provided with a plurality of inclined guiding grooves 242 in communication with an inner side and an outer side of the bracket 240. The low-transmission and high-reflection lens 222 is provided with a plurality of guiding columns 60, which pass through the plurality of inclined guiding grooves 242 (the guiding columns 60 and the inclined guiding grooves 242 are in one-to-one correspondence) and are tightly fitted with the knob 250. The low-reflection concave lens 224 can be assembled in the bracket 240 by dispensing, baking, and curing (after a UV thermo-curing adhesive 80 is dispensed at a preset position of the bracket 240, the low-reflection concave lens 224 is assembled thereon, then the UV thermo-curing adhesive 80 is irradiated with ultra-violet light for preliminary curing, and finally sent to the oven for baking, to assemble the low-reflection concave lens 224 to the preset position of the bracket 240). When the knob 250 rotates in a circumferential direction, the plurality of guiding columns 60 are driven to move along the plurality of inclined guiding grooves 242 to adjust the relative position of the low-transmission high-reflection lens 222 and the low-reflection concave lens 224. Thus, without increasing the actual thickness of the display module 200, a simple inclined plane rotation configuration can be used to adjust the relative position of the low-transmission and high-reflection lens 222 and the low-reflection concave lens 224 to adjust the diopter for eyesight of different users.

Figure 5:
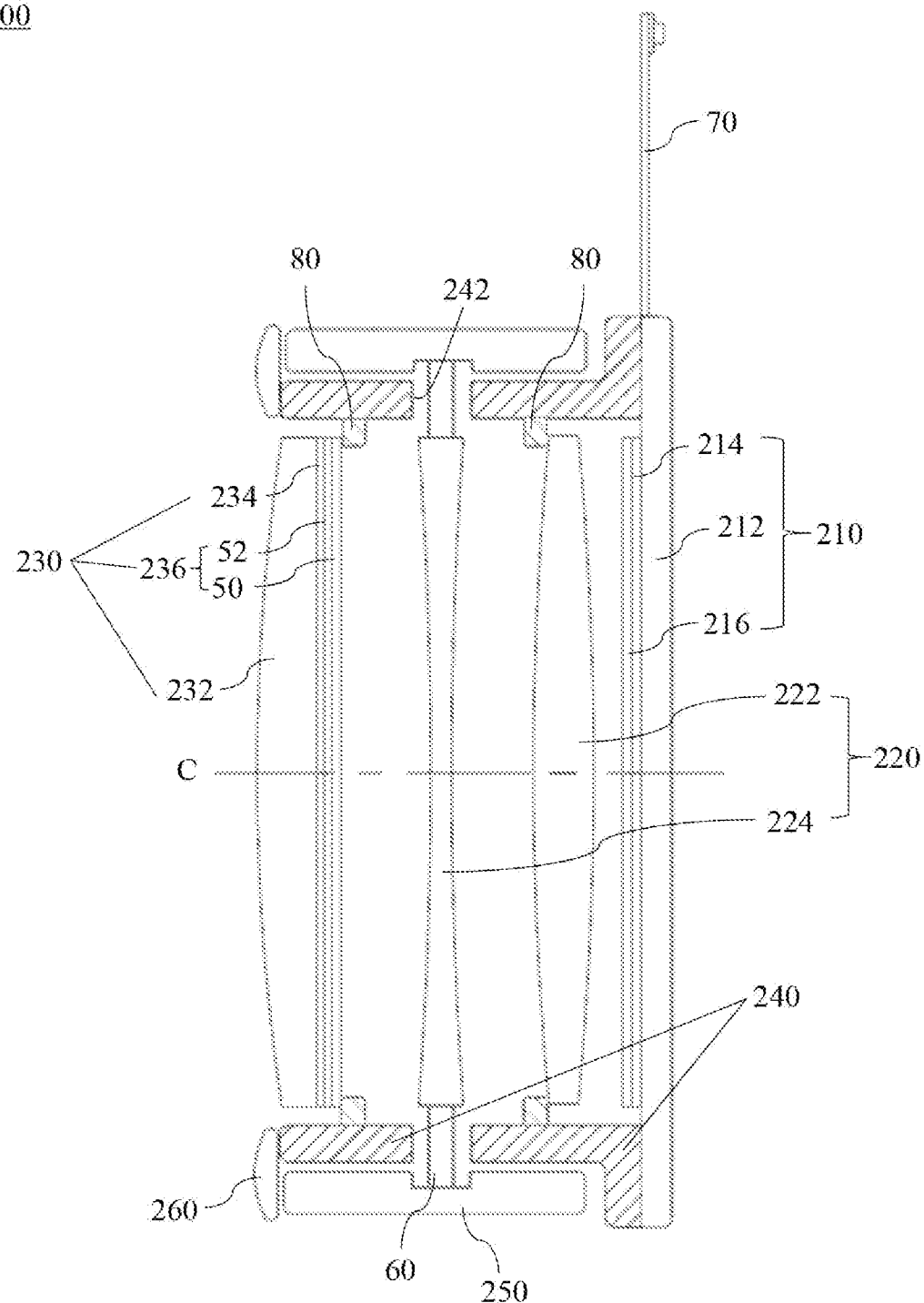
FIG. 5 is a schematic cross-sectional view of a display module of an embodiment of the present disclosure.

In another embodiment, referring to FIG. 5, which is a schematic cross-sectional view of a display module of an embodiment of the present disclosure. The only difference between the display module 300 of FIG. 5 and the display module 200 of FIG. 3 is: the low-reflection concave lens 224 is provided with a plurality of guiding columns 60, which pass through the plurality of inclined guiding grooves 242 and are tightly fitted with the knob 250; the low-transmission and high-reflection lens 222 can be assembled in the bracket 240 by dispensing, baking and curing (after an UV thermo-curing adhesive 80 is dispensed at a preset position of the bracket 240, the low-transmission and high-reflection lens 222 is assembled thereon, then the UV thermo-curing adhesive 80 is irradiated with ultraviolet light for preliminary curing, and finally sent to the oven for baking, to assemble the low-transmission and high-reflection lens 222 to the preset position of the bracket 240); when the knob 250 rotates in a circumferential direction, the plurality of guiding columns 60 are driven to move along the plurality of inclined guiding grooves 242 to adjust the relative position of the low-transmission high-reflection lens 222 and the low-reflection concave lens 224.

Figure 6:
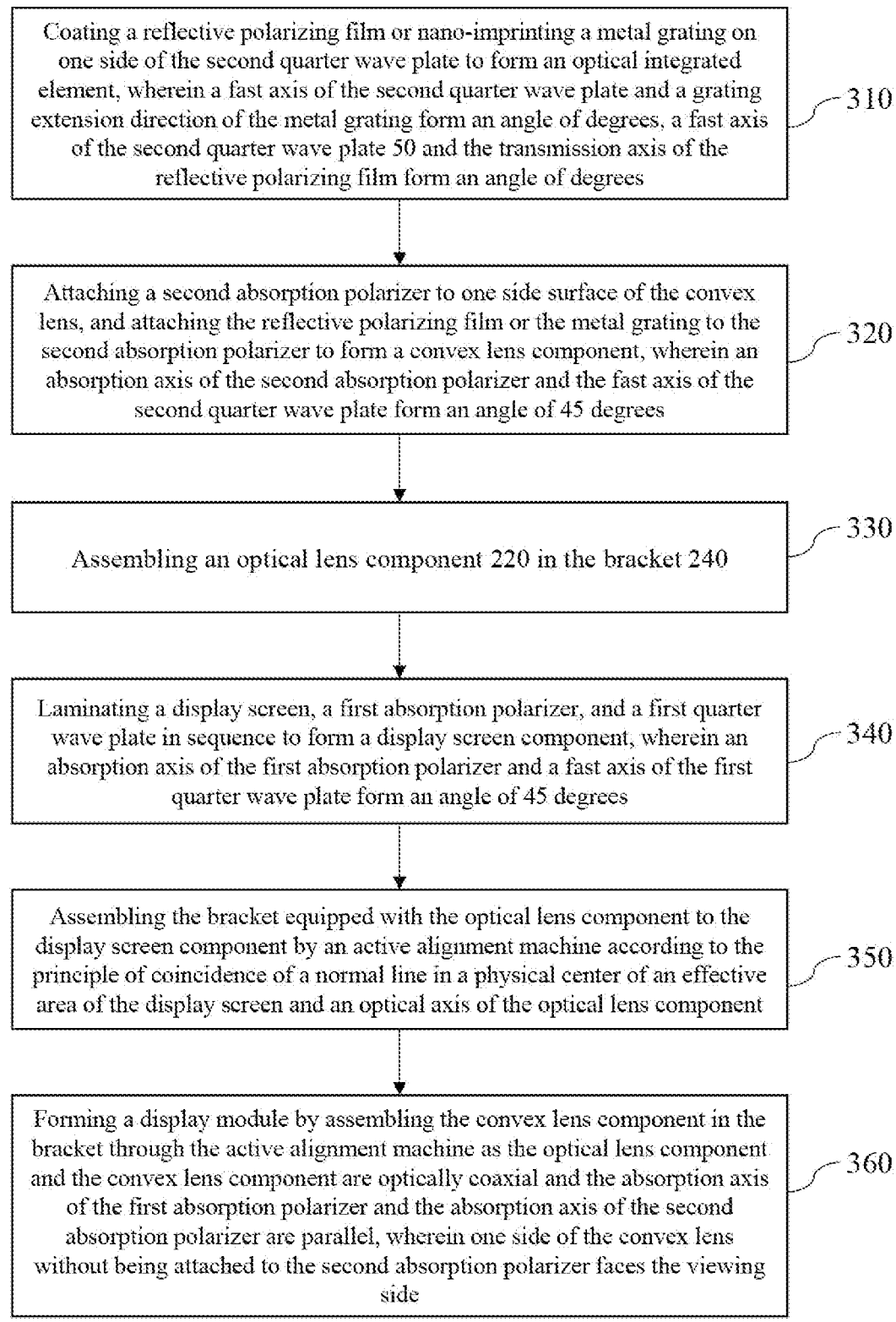
FIG. 6 is a flowchart of a method for manufacturing display module of an embodiment of the present disclosure.

FIG. 6 is a flowchart of a method for manufacturing display module of an embodiment of the present disclosure. The manufacturing method of the display module shown in FIG. 6 can be used to manufacture the display module 200 of FIG. 2 to FIG. 4, which comprises the steps of: coating a reflective polarizing film 52 or nano-imprinting a metal grating on one side of the second quarter wave plate 50 to form an optical integrated element 236, wherein a fast axis of the second quarter wave plate 50 and a grating extension direction of the metal grating form an angle of 45 degrees, a fast axis of the second quarter wave plate 50 and the transmission axis of the reflective polarizing film form an angle of 45 degrees (step 310); attaching a second absorption polarizer 234 to one side surface of the convex lens 232, and attaching the reflective polarizing film 52 or the metal grating to the second absorption polarizer 234 to form a convex lens component 230, wherein an absorption axis of the second absorption polarizer 234 and the fast axis of the second quarter wave plate 50 form an angle of 45 degrees (step 320); assembling an optical lens component 220 in the bracket 240 (step 330); laminating a display screen 212, a first absorption polarizer 214, and a first quarter wave plate 216 in sequence to form a display screen component 210, wherein an absorption axis of the first absorption polarizer 214 and a fast axis of the first quarter wave plate 216 form an angle of 45 degrees (step 340); assembling the bracket 240 equipped with the optical lens component 220 to the display screen component 210 by an active alignment (AA) machine according to the principle of coincidence of a normal line in a physical center of an effective area of the display screen 212 and an optical axis of the optical lens component 220 (step 350); and forming a display module 200 by assembling the convex lens component 230 in the bracket 240 through the active alignment machine as the optical lens component 220 and the convex lens component 230 are optically coaxial (on optical axis C) and the absorption axis of the first absorption polarizer 214 and the absorption axis of the second absorption polarizer 234 are parallel, wherein one side of the convex lens 232 without being attached to the second absorption polarizer 234 faces the viewing side (step 360).

In one embodiment, referring to FIG. 6, the step of forming the optical integrated element 236 in step 310 may further comprise: coating an ultra-low reflection film layer, pasting an ultra-low reflection film, or pasting a lens coated with the ultra-low reflection film on one side surface of the second quarter wave plate 50 opposite to the reflective polarizing film 52 or the metal grating. Wherein, when coating an ultra-low reflection film layer on one side surface of the second quarter wave plate 50 opposite to the reflective polarizing film 52 or the metal grating, the operating temperature needs to be controlled below 95 degrees Celsius.

In one embodiment, referring to FIG. 6, in step 320, the second absorption polarizer 234 can be attached to the convex lens 232 through optical grade OCA adhesive having a transmittance of 99%, and the reflective polarizing film 52 or metal grating can be attached to the second absorption polarizer 234 through optical grade OCA adhesive having 99% light transmittance, then put into a high vacuum chamber with a temperature of 60 degrees Celsius for 1 hour for defoaming to form the convex lens component 230. Besides, before the reflective polarizing film 52 or the metal grating is attached to the second absorption polarizer 234, the direction of the absorption axis of the second absorption polarizer 234 and the direction of the fast axis of the second quarter wave plate 50 can be measured by a specific machine, respectively, the reflective polarizer film 52 or metal grating can be precisely attached to the second absorption polarizer 234 according to the angle of 45 degrees between the absorption axis of the second absorption polarizer 234 and the fast axis of the second quarter wave plate 50.

In one embodiment, referring to FIG. 2, FIG. 3, and FIG. 6, since the optical lens component 220 may comprise a low-transmission and high-reflection concave lens 224, low-transmission and high-reflection lens 222 and the low-reflection concave lens 224 could be coaxial (the optical axis C). The low-transmission and high-reflection mirror 222 is provided with a plurality of guiding columns 60. The bracket 240 comprises a plurality of inclined guiding grooves 242 in communication with the inner side and the outer side of the bracket 240. Thus, step 330 may comprise: passing the plurality of guiding columns 60 through the plurality of inclined guiding grooves 242 to assemble the low-transmission and high-reflection lens 222 in the bracket 240; and by the active alignment machine with the low-reflection concave lens 224 for dispensing, baking and curing, the low-reflection concave lens 224 can be assembled in the bracket 240 (i.e., after a UV thermo-curing adhesive 80 is dispensed at a preset position of the bracket 240, the low-reflection concave lens 224 is assembled thereon, then the UV thermo-curing adhesive 80 is irradiated with ultraviolet light for preliminary curing, and finally sent to the oven for baking, to assemble the low-reflection concave lens 224 to the preset position of the bracket 240, where the baking temperature can be, but not limited to 80 degrees Celsius, and the baking time can be, but not limited to 2 hours). Besides, in this embodiment, after step 360, the manufacturing method for the display module may further comprise: sleeving a knob 250 on an outer side of the bracket 240 to enable the plurality of guiding columns 60 to be tightly fitted with the knob 250; and assembling a snap ring 260 to be snapped onto the bracket 240 and limit the movement of the knob 250 along an optical axis. So, when the knob 250 is rotated in a circumferential direction, the plurality of guiding columns 60 would be driven to move along the plurality of inclined guiding grooves 242 to adjust the relative position of the low-transmission and high-reflection lens 222 and the low-reflection concave lens 224.

In another embodiment, referring to FIG. 5 and FIG. 6, since the optical lens component 220 may comprise a low-transmission and high-reflection lens 222 and a low-reflection concave lens 224, low-transmission and high-reflection lens 222 and the low-reflection concave lens 224 could be coaxial (the optical axis C). The low-reflection concave lens 224 is provided with a plurality of guiding columns 60. The bracket 240 comprises a plurality of inclined guiding grooves 242 in communication with the inner side and the outer side of the bracket 240. Thus, step 330 may comprise: processing the low-transmission and high-reflection lens 222 by dispensing, baking, and curing to assemble the low-transmission and high-reflection lens 222 in the bracket 240 (i.e., after a UV thermo-curing adhesive 80 is dispensed at a preset position of the bracket 240, the low-transmission and high-reflection lens 222 is assembled thereon, then the UV thermo-curing adhesive 80 is irradiated with ultraviolet light for preliminary curing, and finally sent to the oven for baking, to assemble the low-transmission and high-reflection lens 222 to the preset position of the bracket 240, where the baking temperature can be, but not limited to 80 degrees Celsius, and the baking time can be, but not limited to 2 hours); and passing the plurality of guiding columns 60 through a plurality of inclined guiding grooves 242 to assemble the low-reflection concave lens 224 in the bracket 240. Besides, in this embodiment, after step 360, the manufacturing method for the display module may further comprise: sleeving a knob 250 on an outer side of the bracket 240 to enable the plurality of guiding columns 60 to be tightly fitted with the knob 250; and assembling a snap ring 260 to be snapped onto the bracket 240 and limit the movement of the knob 250 along an optical axis. So, when the knob 250 is rotated in a circumferential direction, the plurality of guiding columns 60 would be driven to move along the plurality of inclined guiding grooves 242 to adjust the relative position of the low-transmission and high-reflection lens 222 and the low-reflection concave lens 224.

In one embodiment, referring to FIG. 6, in step 340, the first absorption polarizer 214 can be attached to the display screen 212 through optical grade OCA adhesive having a transmittance of 99%, the first quarter wave plate 216 can be attached to the first absorption polarizer 214 through optical grade OCA adhesive having 99% light transmittance, then put into a high vacuum chamber with a temperature of 60 degrees Celsius for 1 hour for defoaming to form the display screen component 210. Besides, before the first quarter wave plate 216 is attached to the first absorption polarizer 214, the absorption axis direction of the first absorption polarizer 214 and the fast axis direction of the first quarter wave plate 216 can be measured by a special machine, respectively. The first quarter wave plate 216 can be precisely attached to the first absorption polarizer 214 according to the angle of 45 degrees between the absorption axis of the first absorption polarizer 214 and the fast axis of the first quarter wave plate 216.

In one embodiment, referring to FIG. 6, step 350 of assembling the bracket 240 having the optical lens component 220 to the display screen component 210 may comprise: assembling the bracket 240 equipped with the optical lens component 220 to the display screen component 210 by adhesive, where the adhesive method may be, but not limited to, the dispensing, baking, and curing.

In one embodiment, referring to FIG. 6, step 360 may comprise: assembling the convex lens component 230 in the bracket 240 through the active alignment machine with dispensing, baking, and curing treatment to the convex lens component 230 as the optical lens component 220 and the convex lens component 230 are optically coaxial (on optical axis C) and the absorption axis of the first absorption polarizer 214 and the absorption axis of the second absorption polarizer 234 are parallel (i.e., after a UV thermo-curing adhesive 80 is dispensed at a preset position of the bracket 240, the convex lens component 230 is assembled thereon, then the UV thermo-curing adhesive 80 is irradiated with ultraviolet light for preliminary curing, and finally sent to the oven for baking, to assemble the convex lens component 230 to the preset position of the bracket 240, where the baking temperature can be, but not limited to 80 degrees Celsius, and the baking time can be, but not limited to 2 hours).

Figure 7:
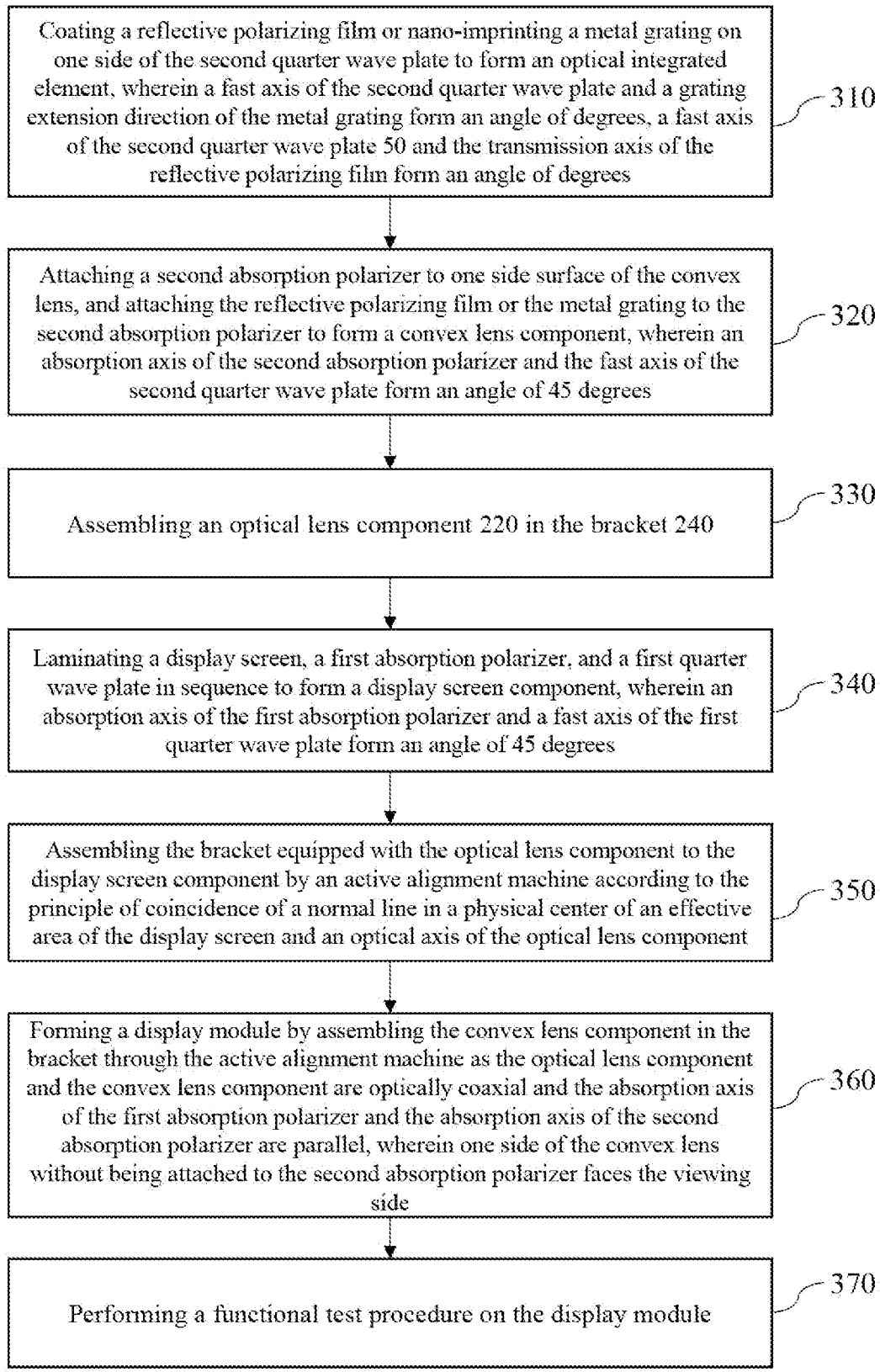
FIG. 7 is a flowchart of a method for manufacturing display module of another embodiment of the present disclosure.

In one embodiment, referring to FIG. 7, which is a flowchart of a method for manufacturing display module of another embodiment of the present disclosure. In addition to the above steps 310 to 360, the manufacturing method of the display module may further comprise: performing a functional test procedure on the display module 200 (step 370). The functional test procedure comprises: testing black point, optical modulation transfer function (MTF) performance, luminance, chromaticity, and power. When the test result of the display module 200 meets the shipping standard, the manufacturing of the display module 200 is complete.

It should be noted that, if there is no relationship between the above steps, the present disclosure would not limit the sequence of the above steps.

In summary, through the optical integrated element having the functions of phase delay and reflective polarization, the number of times of reflection, scattering and transmission of light emitted by the display screen in the folded-type light path can be reduced to improve the utilization rate of light energy and reduce the thickness of the display module.

In the display module: definition can be improved through high quality display screen; scattered light reflected by interfaces can be reduced with linear polarizers having high polarization efficiency; the polarization state of the folded-type optical path can be precisely controlled by the first quarter wave plate having high delay accuracy; the transmitted scattered light in the display module can be reduced by the low-transmission and high-reflection lens; the definition of the four corners and distortion on the display can be improved by the low-transmission and high-reflection lens, the low-reflection concave lens, and the convex lens; a simple inclined plane rotation configuration can be used to adjust the relative position of the low-transmission and high-reflection lens and the low-reflection concave lens to adjust the diopter for eyesight of different users. The manufacturing method of the display module can ensure the optical consistency of the display module and effectively reduce dizziness through the automatic alignment and automatic component of the active alignment machine. In the manufacturing method of the display module, with a specific machine, the absorption axis direction of the second absorption polarizer, the fast axis direction of the second quarter wave plate, the absorption axis direction of the first absorption polarizer, and the fast axis direction of the first quarter wave plate can be firstly measured, followed by the rest of the assembling to precisely control the polarization state and reduce scattered images caused by the polarization state anomaly.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A display module, comprising a display screen component, an optical lens component, and a convex lens component in sequence from a display side to a viewing side, the optical lens component and the convex lens component being optically coaxial;

the display screen component comprising a display screen, a first absorption polarizer, and a first quarter wave plate in sequence from the display side to the viewing side;

the convex lens component comprising a convex lens, a second absorption polarizer, and an optical integrated element, which being laminated in sequence from the viewing side to the display side, the optical integrated element comprising a second quarter wave plate and, on one side surface of the optical integrated element, a coated reflective polarizing film or a nano-imprinted metal grating, the reflective polarizing film or the metal grating being attached to the second absorption polarizer;

wherein an absorption axis of the first absorption polarizer is parallel to an absorption axis of the second absorption polarizer; a fast axis of the second quarter wave plate and a grating extension direction of the metal grating form an angle of 45 degrees; the fast axis of the second quarter wave plate and a transmission axis of the reflective polarizing film form an angle of 45 degrees; the absorption axis of the first absorption polarizer and a fast axis of the first quarter wave plate form an angle of 45 degrees; the absorption axis of the second absorption polarizer and the fast axis of the second quarter wave plate form an angle of 45 degrees.

2. The display module according to claim 1, wherein the transmittance of the reflective polarizing film or the metal grating to P light is greater than or equal to 85±15%; the reflectivity of the reflective polarizing film or the metal grating to S light is greater than or equal to 85±15%; the transmittance of the reflective polarizing film or the metal grating to the S light is less than or equal to 2%.

3. The display module according to claim 1, wherein the thickness of the reflective polarizing film or the metal grating is greater than or equal to 300 nm and less than or equal to 1 μm.

4. The display module according to claim 1, wherein the thickness of the second quarter wave plate is greater than or equal to 50 μm and less than or equal to 200 μm.

5. The display module according to claim 1, wherein the display screen is an LCD screen or an OLED screen.

6. The display module according to claim 1 comprising a bracket in which the optical lens component and the convex lens component being assembled, the bracket being assembled to the display screen component according to the principle of coincidence of a normal line in a physical center of an effective area of the display screen and an optical axis of the optical lens component.

7. The display module according to claim 6, wherein the optical lens component comprises a low-transmission and high-reflection lens and a low-reflection concave lens in sequence from the display side to the viewing side.

8. The display module according to claim 7 comprising a knob and a snap ring, the low-transmission and high-reflection lens, the low-reflection concave lens, and the convex lens component being assembled in the bracket, the knob being sleeved on the outside of the bracket, the snap ring being snapped onto the bracket and restricting the movement of the knob in a direction of an optical axis, the bracket being provided with a plurality of inclined guiding grooves in communication with an inner side and an outer side of the bracket, the low-transmission and high-reflection lens or the low-reflection concave lens comprising a plurality of guiding columns, the plurality of guiding columns passing through the plurality of inclined guiding grooves and tightly matching with the knob, when the knob rotating in a circumferential direction, the plurality of guiding columns being driven to move along the plurality of inclined guiding grooves to adjust a relative position between the low-transmission and high-reflection lens and the low-reflection concave lens.

9. The display module according to claim 1, wherein one side surface of the second quarter wave plate opposite to the reflective polarizing film or to the metal grating is coated with an ultra-low reflection film layer, pasted with an ultra-low reflection film, or pasted with a lens coated with the ultra-low reflection film.

10. The display module according to claim 9, wherein the reflectivity of the ultra-low reflection film layer or the ultra-low reflection film to visible light is less than or equal to 0.5%.

11. The display module according to claim 9, wherein the thickness of the ultra-low reflection film layer or the ultra-low reflection film is less than or equal to 1 μm.

12. The display module according to claim 9, wherein the ultra-low reflection film layer or the ultra-low reflection film comprises one or more layers of film materials.

* * * * *